United States Patent
Huang et al.

(10) Patent No.: US 8,357,998 B2
(45) Date of Patent: Jan. 22, 2013

(54) WIREBONDED SEMICONDUCTOR PACKAGE

(75) Inventors: Wen Pin Huang, Tainan (TW); Cheng Tsung Hsu, Chaojhou Township, Pingtung County (TW); Cheng Lan Tseng, Kaohsiung (TW); Chih Cheng Hung, Kaohsiung (TW); Yu Chi Chen, Syuejia Township, Tainan County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 298 days.

(21) Appl. No.: 12/686,979

(22) Filed: Jan. 13, 2010

(65) Prior Publication Data

US 2010/0200969 A1    Aug. 12, 2010

Related U.S. Application Data

(60) Provisional application No. 61/150,801, filed on Feb. 9, 2009.

(30) Foreign Application Priority Data

Jun. 25, 2009  (TW) ............................... 98121318 A (51) Int. Cl.
*H01L 23/48* (2006.01)
*H01L 23/495* (2006.01)
*H01L 21/50* (2006.01)

(52) U.S. Cl. ............. 257/666; 257/E23.02; 257/E23.07; 257/E23.031; 257/E23.024; 257/E23.01; 257/690; 257/784; 257/786; 257/676; 257/782; 257/693; 257/692; 257/741

(58) Field of Classification Search .................. 257/784, 257/786, E23.02, 737, 738, 692, 741, 762, 257/E23.07, 676, E23.031, 782, 693, E23.024, 257/666, 690, E23.01, E21.499; 438/124
See application file for complete search history.

(56) References Cited

U.S. PATENT DOCUMENTS

| | | | |
|---|---|---|---|
| 3,443,914 A | 5/1969 | Hayashi | |
| 3,662,454 A | 5/1972 | Miller | |
| 4,098,447 A | 7/1978 | Edson et al. | |
| 4,395,320 A | 7/1983 | Kasashima et al. | |
| 4,415,115 A | 11/1983 | James | |
| 4,564,734 A | 1/1986 | Okikawa | |
| 4,886,200 A | 12/1989 | Tsumura | |
| 4,909,427 A | 3/1990 | Plaisted et al. | |
| 5,060,051 A | 10/1991 | Usuda | |
| 5,252,182 A * | 10/1993 | Hong | .............................. 438/21 |
| 5,293,073 A | 3/1994 | Ono | |

(Continued)

OTHER PUBLICATIONS

Huang, U.S. Appl. No. 12/642,081, filed Dec. 18, 2009 for "Semiconductor Package and Method of Manufacturing the Same". Office Action mailed Sep. 6, 2011.

(Continued)

*Primary Examiner* — A O Williams
(74) *Attorney, Agent, or Firm* — Foley & Lardner LLP (57) ABSTRACT

In a method of manufacturing a semiconductor package including a wire binding process, a first end of the bonding wire is bonded to a first pad so as to form a first bond portion. A second end of the bonding wire is bonded to a second pad, wherein an interface surface between the bonding wire and the second pad has a first connecting area. The bonded second end of the bonding wire is scrubbed so as to form a second bond portion, wherein a new interface surface between the bonding wire and the second pad has a second connecting area larger than the first connecting area. A remainder of the bonding wire is separated from the second bond portion.

20 Claims, 12 Drawing Sheets

U.S. PATENT DOCUMENTS

| | | | |
|---|---|---|---|
| 5,298,793 | A | 3/1994 | Kotani et al. |
| 5,337,941 | A | 8/1994 | Higashiura et al. |
| 5,455,195 | A | 10/1995 | Ramsey et al. |
| 5,635,115 | A * | 6/1997 | Konishi et al. ............... 264/1.7 |
| 6,046,504 | A | 4/2000 | Kimura |
| 6,062,462 | A | 5/2000 | Gillotti et al. |
| 6,100,598 | A | 8/2000 | Kanesaka |
| 6,164,523 | A | 12/2000 | Fauty et al. |
| 6,234,376 | B1 | 5/2001 | Wicen |
| 6,329,722 | B1 | 12/2001 | Shih et al. |
| 6,439,450 | B1 | 8/2002 | Chapman et al. |
| 6,547,540 | B1 | 4/2003 | Horng et al. |
| 6,581,816 | B2 | 6/2003 | Vitali et al. |
| 6,664,136 | B2 | 12/2003 | Motonami et al. |
| 6,729,528 | B2 | 5/2004 | Seki et al. |
| 6,780,467 | B2 | 8/2004 | Imori |
| 6,800,555 | B2 | 10/2004 | Test et al. |
| 6,815,789 | B2 | 11/2004 | Tiziani et al. |
| 6,853,056 | B2 | 2/2005 | Fukatani et al. |
| 6,966,480 | B2 | 11/2005 | Chapman et al. |
| 6,974,776 | B2 | 12/2005 | Dean et al. |
| 7,067,929 | B2 * | 6/2006 | Hanaoka et al. ............. 257/784 |
| 7,214,606 | B2 | 5/2007 | Wong et al. |
| 7,294,217 | B2 | 11/2007 | Beatson et al. |
| 7,411,157 | B2 | 8/2008 | Brunner et al. |
| 7,413,974 | B2 | 8/2008 | Test et al. |
| 7,427,009 | B2 | 9/2008 | Lim et al. |
| 7,476,597 | B2 * | 1/2009 | Subido et al. ............... 438/473 |
| 7,523,848 | B2 | 4/2009 | Beatson et al. |
| 7,535,104 | B2 | 5/2009 | Test et al. |
| 7,550,844 | B2 | 6/2009 | Matsuki et al. |
| 7,820,913 | B2 | 10/2010 | Uno et al. |
| 2003/0173659 | A1 | 9/2003 | Lee et al. |
| 2004/0238926 | A1 * | 12/2004 | Obinata ....................... 257/678 |
| 2005/0067382 | A1 | 3/2005 | Gillotti et al. |
| 2005/0199677 | A1 | 9/2005 | Sadler et al. |
| 2005/0242446 | A1 | 11/2005 | Jin |
| 2006/0027623 | A1 * | 2/2006 | Yanagisawa ................. 228/4.5 |
| 2006/0032894 | A1 * | 2/2006 | Wong ........................ 228/180.5 |
| 2006/0046340 | A1 * | 3/2006 | Murakami et al. ............ 438/68 |
| 2006/0186553 | A1 | 8/2006 | Ohta et al. |
| 2008/0083815 | A1 | 4/2008 | Nachon et al. |
| 2008/0099531 | A1 | 5/2008 | Wong et al. |
| 2008/0116548 | A1 | 5/2008 | Li et al. |
| 2008/0203568 | A1 | 8/2008 | Tanaka et al. |
| 2008/0229573 | A1 * | 9/2008 | Wood et al. ................... 29/742 |
| 2008/0233733 | A1 | 9/2008 | Lin |
| 2008/0265385 | A1 | 10/2008 | Tsai et al. |
| 2008/0272487 | A1 | 11/2008 | Shim et al. |
| 2008/0314963 | A1 | 12/2008 | Itzhaky et al. |
| 2009/0108436 | A1 * | 4/2009 | Fujii et al. ..................... 257/693 |
| 2009/0121362 | A1 * | 5/2009 | Jang ............................ 257/782 |
| 2009/0201657 | A1 * | 8/2009 | Tanaka et al. ............... 361/783 |
| 2009/0269890 | A1 * | 10/2009 | Shimanuki ................... 438/124 |
| 2010/0007004 | A1 | 1/2010 | Chang et al. |
| 2010/0007009 | A1 * | 1/2010 | Chang et al. ................. 257/692 |
| 2010/0007010 | A1 | 1/2010 | Chang et al. |
| 2010/0007011 | A1 | 1/2010 | Hung et al. |
| 2010/0200974 | A1 | 8/2010 | Weng et al. |
| 2010/0200981 | A1 | 8/2010 | Huang et al. |
| 2010/0258921 | A1 * | 10/2010 | Chang Chien et al. ....... 257/676 |
| 2011/0049219 | A1 | 3/2011 | Huang et al. |
| 2012/0018768 | A1 * | 1/2012 | Li et al. .......................... 257/99 |

OTHER PUBLICATIONS

Appelt, et al. "Fine pitch copper wire bonding introduction to high volume production." Electronics System Integration Techn. Conf. Berlin (Sep. 2010).

* cited by examiner

FIG.20

WIREBONDED SEMICONDUCTOR PACKAGE

CROSS REFERENCE TO RELATED APPLICATIONS

This application claims the priority benefit of U.S. Provisional Application Ser. No. 61/150,801, filed on Feb. 9, 2009, and Taiwan Patent Application Serial Number 098121318, filed on Jun. 25, 2009. The full disclosures of the above-identified applications are incorporated herein by reference.

TECHNICAL FIELD

The disclosure is related to a method of manufacturing a semiconductor package, and more particularly to a method of manufacturing a semiconductor package including a wire bonding process.

BACKGROUND

Figure 1:
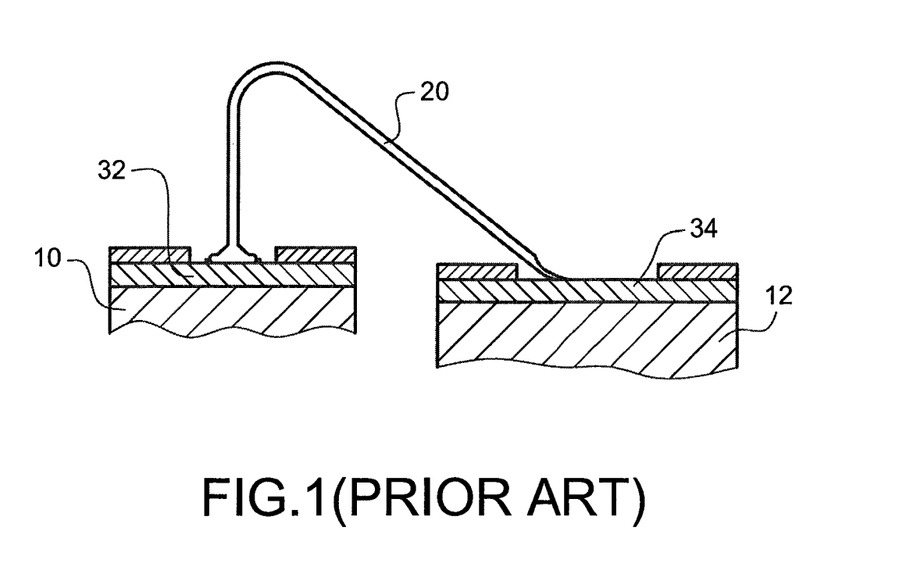
FIG. 1 is a cross-sectional view showing a wire bonding structure obtained by a known wire bonding process.

Referring to FIG. 1, according to a process for manufacturing a semiconductor package, a wire bonding process widely applied to form an electrical connection between a pad 11 of a chip 10 and a pad 13 of a substrate 12 by using a bonding wire 14. Such a wire bonding process is mainly based on gold (Au) wires, but copper (Cu) wires have an advantage of low cost. Compared with gold, copper has better electric conductivity and thermal conductivity, whereby a copper bonding wire has a thinner wire diameter and better heat dissipation than an electrically comparable gold wire. However, copper has disadvantages of insufficient ductility and easy oxidation such that the utilization of copper bonding wires is restricted.

Recently, copper bonding wires are mostly applied to chip pads with a big size or on low dielectric material (low-k) wafers, because the success of a wire bonding process using copper bonding wires depends on the structural strength of the chip pads. In order to avoid the failure of the wire bonding process using copper bonding wires, there is a limit on how small the chip pads can be.

Figure 2:
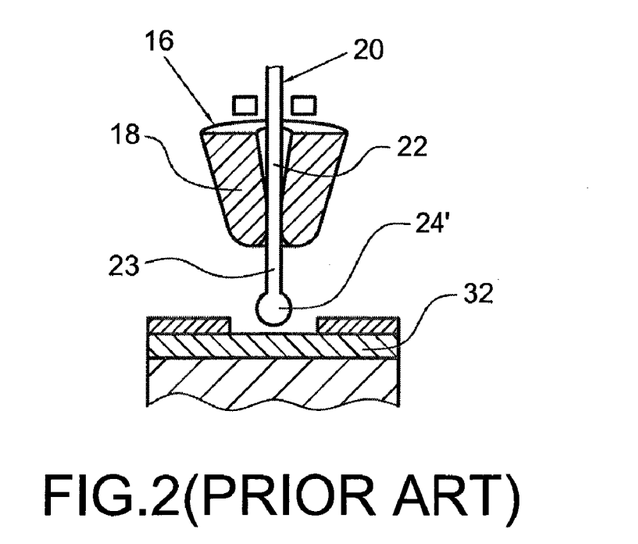
FIGS. 2 to 8 are cross-sectional views showing several steps of a known process of bonding a copper bonding wire.
Figure 3:
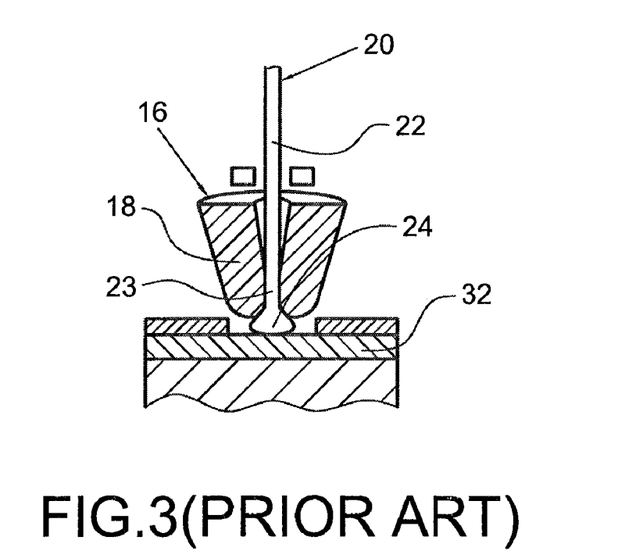
Figure 4:
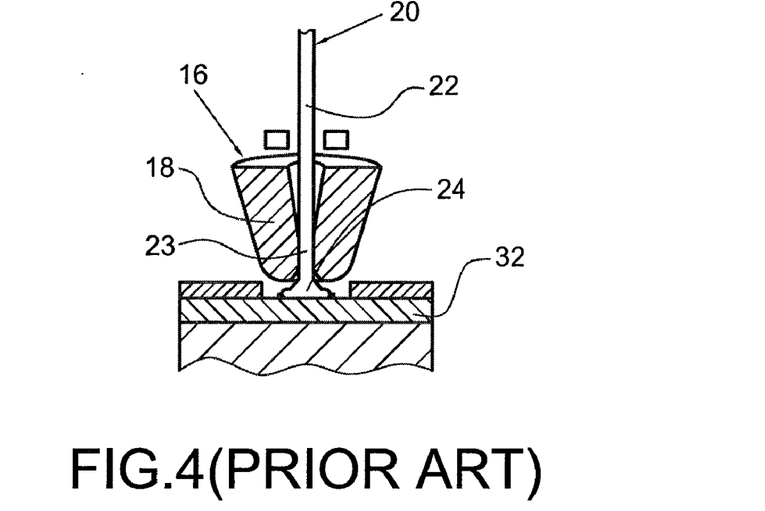
Figure 5:
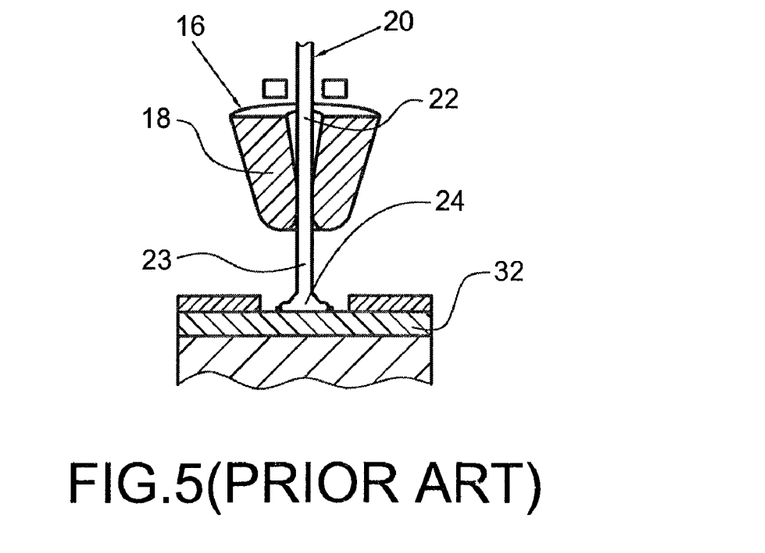
Figure 6:
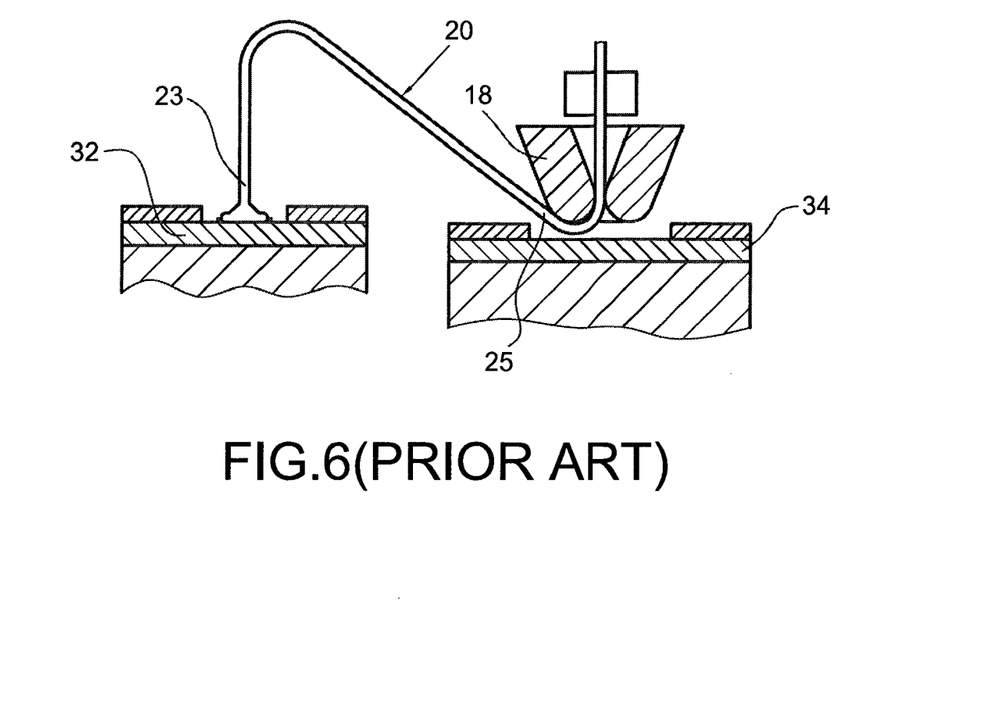
Figure 7:
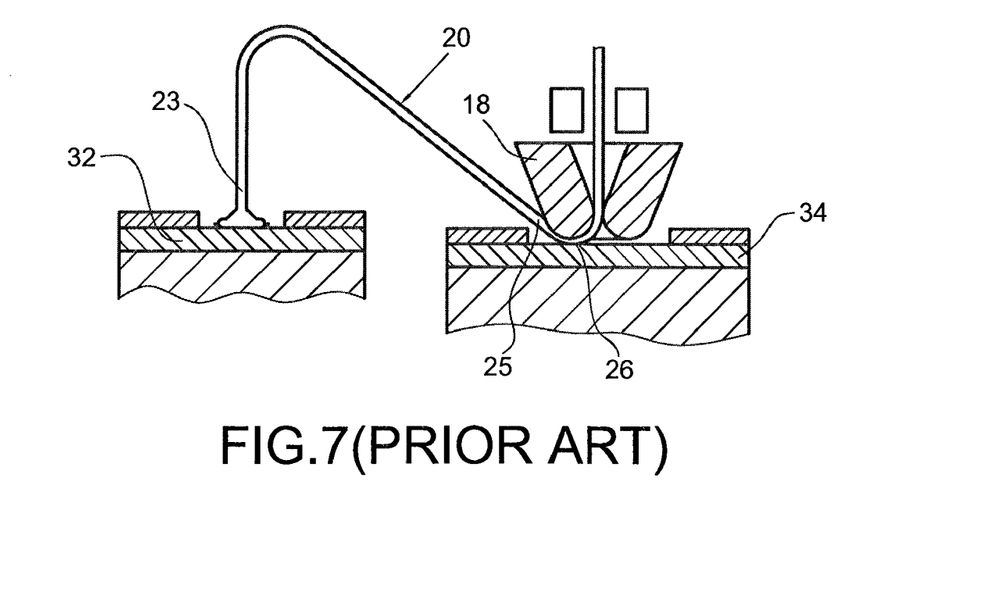
Figure 8:
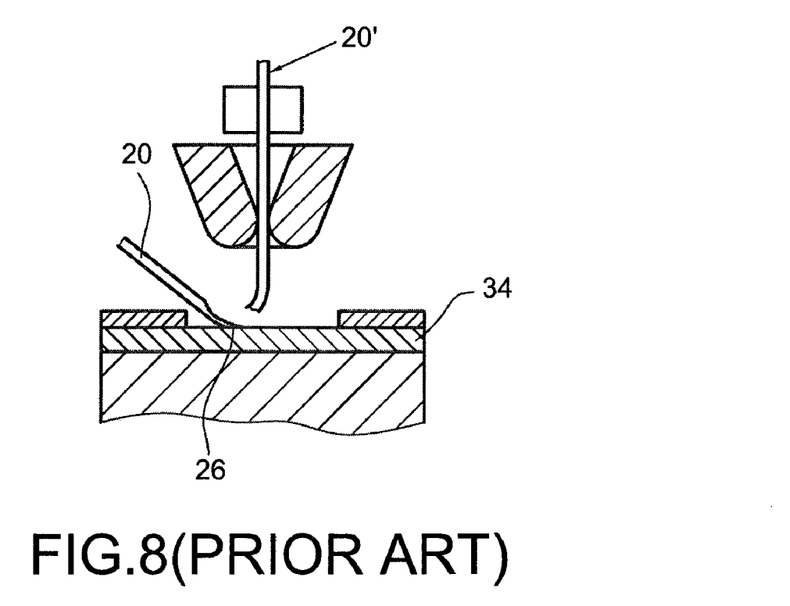
Figure 9:
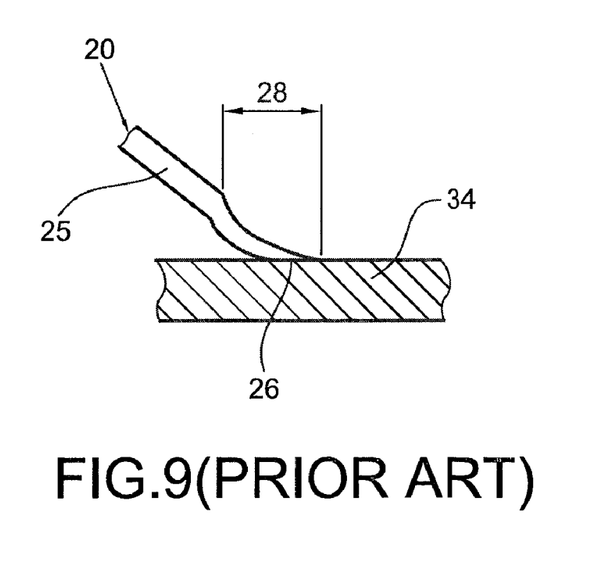
FIG. 9 is an enlarged view of the finished wire bonding structure of FIG. 8 where a fishtail region is formed on the second end of the copper bonding wire.

FIGS. 2 to 8 are cross-sectional views depicting several steps in a known method of bonding a copper bonding wire. Referring to FIG. 2, a copper bonding wire 20 is provided by a wire bonding machine 16, wherein the copper bonding wire 20 includes a copper line 22. Then, one end of the copper line 22 is formed into a copper ball 24', which remains physically connected to the copper line 22, by an electrical sintering process. Referring to FIG. 3, the copper ball 24' is pressed and then deformed into an arc-shaped part 24 by a wire bonding capillary 18 of the wire bonding machine 16. Referring to FIG. 4, the arc-shaped part 24 is bonded to a chip pad 32 by a vibration process, e.g., by ultrasonic vibrations, thereby forming a first bond portion. Referring to FIG. 5, the capillary 18 is upward moved to a predetermined height. Referring to FIG. 6, the copper bonding wire 20 is curved by movement of the capillary 18 to a bonding site. The necessary length of the copper bonding wire 20 is automatically provided by the wire bonding machine 16. Referring to FIG. 7, the capillary 18 presses the second end 25 of the copper bonding wire 20 onto a substrate pad 34, and the second end 25 is bonded to the substrate pad 34 by another vibration process, thereby forming a second bond portion 26. Referring to FIG. 8, the remaining part 20' of the copper bonding wire 20 is separated from the second bond portion 26 so as to finish the wire bonding structure. Referring to FIG. 9 which is an enlarged view of the finished wire bonding structure of FIG. 8, an interface surface between the copper bonding wire 20 and the substrate pad 34 has a connecting area, i.e., the connecting area where the second bond portion 26 contacts the substrate pad 34. A fishtail region 28 is formed on the second end 25 of the copper bonding wire 20 by the pressing action of the capillary 18. The fishtail region 28 is adjacent to the interface surface between the copper bonding wire 20 and the substrate pad 34, i.e., the second bond portion 26 includes the fishtail region 28. The cross-section of the fishtail region 28 does not include any protrusion, i.e., the cross-section of the fishtail region 28 includes a smoothly curved line.

However, according to the known wire bonding process of bonding a copper bonding wire, the connecting area between the copper bonding wire and the substrate pad is not always sufficiently large, and therefore, a sufficient bonding strength between the copper bonding wire and the substrate pad is not always obtainable. Thus, the copper bonding wire might be peeled off the substrate pad at the second bond portion during subsequent manufacturing or transporting process, which, in turn, will cause the chip to malfunction

SUMMARY

In one or more embodiments, a semiconductor package comprises: a chip, a carrier, a bonding wire and a molding compound. The chip has a first surface and a second surface opposite to the first surface. The chip comprises a first pad located on the first surface. The carrier has a third surface and a fourth surface opposite to the third surface. The carrier comprises a second pads located on the third surface. The chip is disposed on the carrier. The bonding wire electrically connects the chip to the carrier and comprises a first end bonded to the first pad so as to form a first bond portion, and a second end bonded to the second pad so as to form a second bond portion. The second bond portion comprises a fishtail region which comprises at least one scrubbing protrusion being integrally formed thereon. The molding compound seals the chip and the bonding wire and covers the carrier.

In one or more embodiments, a method of manufacturing a semiconductor package comprising:

disposing a chip on a carrier, wherein the chip has a first surface and a second surface opposite to the first surface, the chip comprises a first pad located on the first surface, the carrier has a third surface and a fourth surface opposite to the third surface, and the carrier comprises a second pad located on the third surface;

providing a bonding wire comprising a first end and a second end;

bonding the first end of the bonding wire to the first pad so as to form a first bond portion;

bonding the second end of the bonding wire to the second pad, wherein an interface surface between the second end of the bonding wire and the second pad has a first connecting area;

after said bonding, scrubbing the bonded second end of the bonding wire so as to form a second bond portion, wherein a new interface surface between the second end of the bonding wire and the second pad has a second connecting area larger than the first connecting area;

separating a remainder of the bonding wire from the second bond portion; and sealing the chip and the bonding wire and covering the carrier by a molding compound to obtain the package.

BRIEF DESCRIPTION OF THE DRAWINGS

Exemplary embodiments will be discussed herein with reference to the accompanying drawings, wherein elements having the same reference numeral designations represent like elements throughout and wherein.

DETAILED DESCRIPTION

Figure 10:
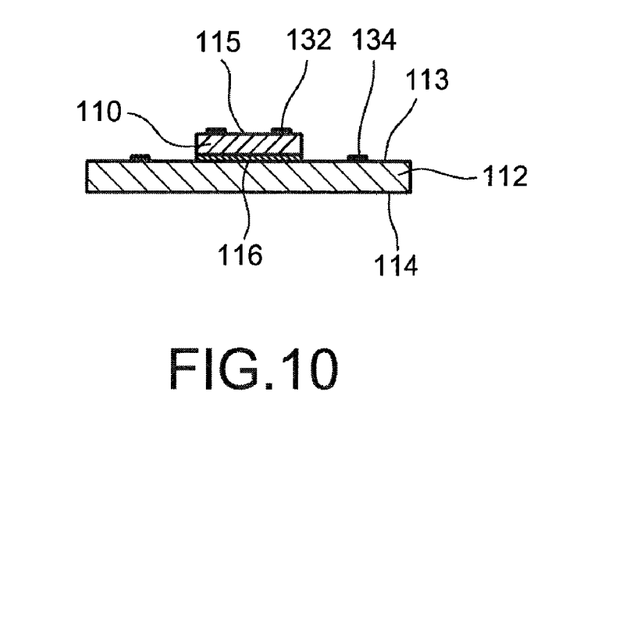
FIG. 10 is a cross-sectional view of a carrier and a chip for use in a method of manufacturing a semiconductor package in accordance with one or more embodiments.
Figure 11:
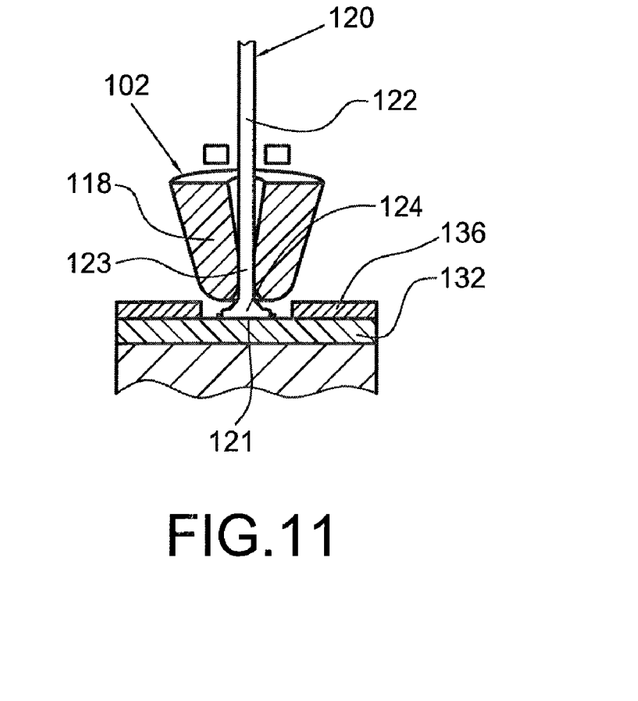
FIG. 11 is a cross-sectional view showing a bonding process of a bonding wire and a first pad in accordance with one or more embodiments.

FIGS. 10 to 16 are views showing various steps in a method of manufacturing a semiconductor package according to one or more embodiments. Referring to FIG. 10, a chip 110 is disposed on a carrier 112, wherein the chip 110 has an active surface 115 and a back surface 116 opposite to the active surface 115. The chip 110 includes at least one first pad 132 (e.g., an aluminum pad or copper pad) located on the active surface 115. The carrier 112 has an upper surface 113 and a lower surface 114 opposite to the upper surface 113, and includes at least one second pad 134 located on the upper surface 113. The back surface 116 of the chip 110 is disposed on the upper surface 113 of the carrier 112. The chip 110 further includes a passivation layer 136 (best seen in FIG. 11), which is formed on the active surface 115 of the chip 110 and exposes the first pad 132, whereby the first pad 132 has an exposed area. Referring to FIG. 11, in the particularly illustrated embodiment, at least one bonding wire 120 is provided by a wire bonding machine 102. The bonding wire 120 can be a copper bonding wire, wherein the weight percentage of copper element of the copper bonding wire can be 99.9% (3N), 99.99% (4N) or 99.999% (5N). Other wire materials are, however, not excluded. Then, the first end 123 of the bonding wire 120 is bonded to the first pad 132 so as to form a first bond portion 121. More particularly, the bonding process of the bonding wire 120 and the first pad 132 includes the following steps. The first end 123 of the bonding wire 120 is formed into a ball-shaped portion (not shown), which remains physically connected to a line portion 122 of the bonding wire 120, by an electrical sintering process. Then, the ball-shaped portion is pressed and then deformed into a non-spherical part 124 by a capillary 118 of the wire bonding machine 102. Then, the non-spherical part 124 is bonded to the first pad 132 by a vibration process, e.g., using ultrasonic vibrations, thereby forming the first bond portion 121. In some embodiments, the line portion 122 of the bonding wire 120 is sealed (or covered) by an anti-oxidative metal. The anti-oxidative metal can be palladium (Pd), i.e., the bonding wire 120 can be a copper/palladium bonding wire wherein a palladium layer covers a copper core. The weight percentage of palladium element of the copper/palladium bonding wire can be between 0.8% and 2.7%.

Figure 12:
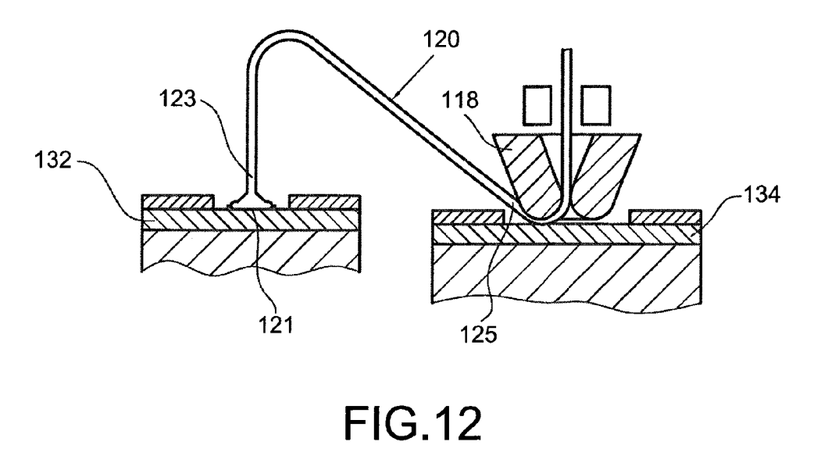
FIG. 12 is a cross-sectional view showing a bonding process of the bonding wire and a second pad in accordance with one or more embodiments.
Figure 13:
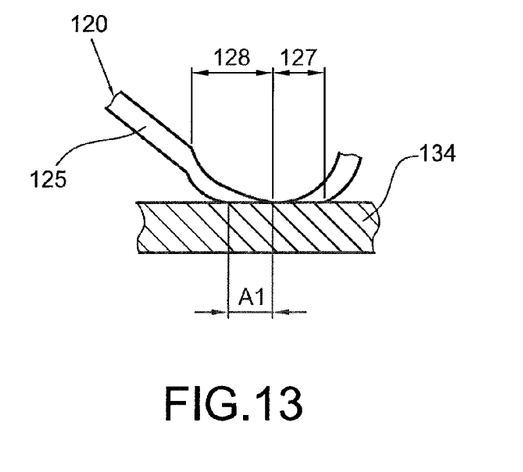
FIG. 13 is an enlarged, cross-sectional view showing a fishtail region formed on the second end of the bonding wire after bonding in accordance with one or more embodiments.

Referring to FIG. 12, the second end 125 of the bonding wire 120 is bonded to the second pad 134, shown in greater detail in FIG. 13. More particularly, the bonding process of the bonding wire 120 and the second pad 134 includes the following steps. The capillary 118 is moved upwardly from the first pad 132 to a predetermined height. Then, the bonding wire 120 is curved by a subsequent movement of the capillary 118 to the second pad 134. A necessary length of the bonding wire 120 is automatically provided by the wire bonding machine 102. Then, the capillary 118 presses the second end 125 of the bonding wire 120 against the second pad 134, and the second end 125 is bonded to the second pad 134 by another vibration process. Referring to FIG. 13 again, after the bonding process of the second end 125 of the bonding wire 120 to the second pad 134, an interface surface between the bonding wire 120 and the second pad 134 has a first connecting area A1 where the second end 125 of the bonding wire 120 contacts the second pad 134. A fishtail region 128 is formed on the second end 125 of the bonding wire 120 by the capillary 118. The fishtail region 128 is adjacent to the interface surface (i.e., A1) between the bonding wire 120 and the second pad 134. The cross-section of the fishtail region 128 is defined by the profile of the capillary 118 when the capillary 118 presses the second end 125 against the second pad 134. In the specifically illustrated embodiment, the fishtail region 128 does not include any protrusion, i.e., the cross-section of the fishtail region 128 includes a smoothly curved line like the capillary 118 in this particularly illustrated embodiment. Furthermore, the capillary 118 defines a separation region 127 located on the second pad 134 and opposite to the fishtail region 128.

Figure 14:
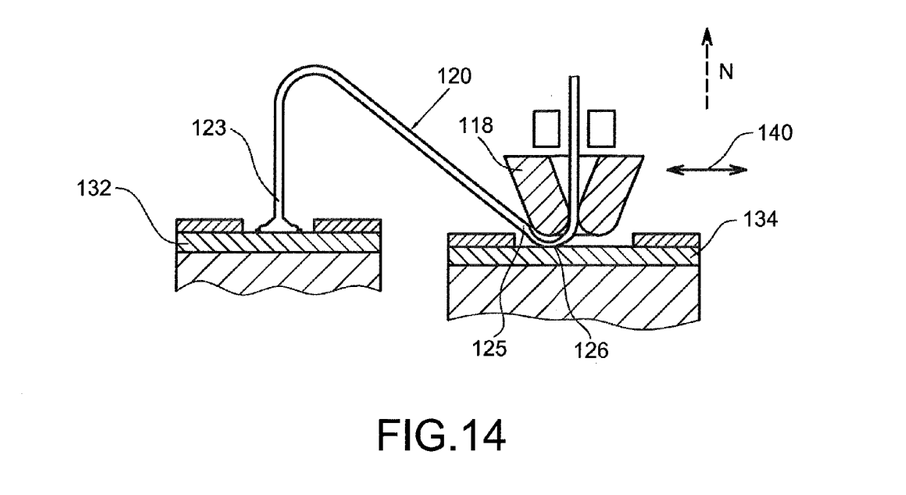
FIG. 14 is a cross-sectional view showing a scrubbing process of the bonding wire in accordance with one or more embodiments.

The separation region 127 is where a remaining part 120' of the bonding wire 120 is to be severed or separated from the second end 125, as disclosed herein. In the specifically illustrated embodiment of FIG. 13, the remaining part 120' on the separation region 127 is shown only partially for the sake of simplicity. Likewise, the remaining part 120' is omitted from FIG. 15 for clarity. As shown in FIG. 14, the remaining part 120' is still connected to the second end 125.

In some other embodiments (not shown), however, the remaining part 120' is severed from the second end 125 after the bonding of the second end 125 to the second pad 134, and before a subsequent scrubbing step as disclosed herein.

Referring to FIG. 14, the surface of the second pad 134 defines a normal vector N oriented in a z-direction. The second end 125 of the bonding wire 120, after being bonded to the second pad 134, is scrubbed by moving the capillary 118 in a direction 140 which is perpendicular to the normal vector N or parallel to the interface surface between the second end 125 and the second pad 134, so as to form a second bond portion 126.

Figure 15:
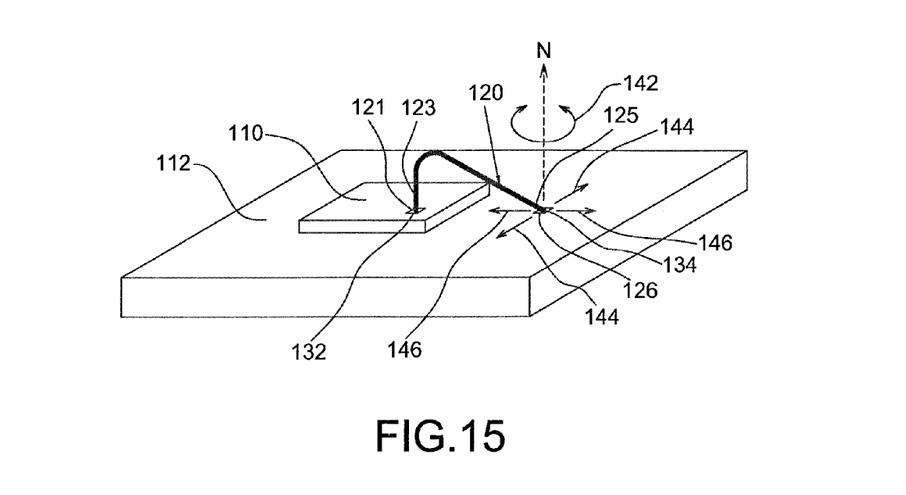
FIG. 15 is a perspective view showing various scrubbing directions in accordance with one or more embodiments.

Referring to FIG. 15, the scrubbing process of the second end 125 of the bonding wire 120 is shown to have multiple scrubbing directions. For example, in one or more embodiments, the second end 125 is scrubbed by rotating the capillary 118 in a rotational direction denoted at 142. In further embodiments, the second end 125 is scrubbed by moving or translating the capillary 118 in an x-direction perpendicular to a plane of the bonding wire 120. In yet further embodiments, the second end 125 is scrubbed by moving or translating the capillary 118 in a y-direction in or parallel to the plane of the bonding wire 120. In one or more embodiments, the scrubbing movements of the capillary 118 are back-and-forth (e.g., vibrations) as shown in FIG. 14 at 140. In further embodiments, the scrubbing movements of the capillary 118 are uni-directional in one or more of the x-, y-, z- and rotational directions. In yet further embodiments, the scrubbing action of the capillary 118 includes a combination of any direction or movement disclosed herein. The scrubbing movements between the capillary 118 and the second end 125 are performed by moving (i.e., translating in the x-y plane, and/or rotating in the rotational direction 142, and/or raising/lowering in the z-direction N) at least one of the second end 125 and the capillary 118 relative to the other. The second end 125 is moved by moving a table (not shown) on which the carrier 112 is held.

In the specifically illustrated embodiment of FIG. 14, the capillary 118, after bonding the second end 125 to second pad 134 at the second bond portion 126, is slightly raised vertically upwardly from the second pad 134 by a height of from about 1 um to about 10 um. The scrubbing action is subsequently performed at the raised position of the capillary 118. During the scrubbing action, the capillary 118 is moved horizontally toward the second end 125 by a distance of from about 1 um to about 10 um.

In one or more embodiments, the scrubbing process of the second end 125 of the bonding wire 120 includes the following steps. A scrubbing direction is defined, wherein the scrubbing direction is the rotational direction 142 about the normal vector (z-direction) N of the second bond portion 126. The second end 125 of the bonding wire 120 is scrubbed in the scrubbing direction.

In other embodiments, the scrubbing process of the second end 125 of the bonding wire 120 includes the following steps. A scrubbing direction is defined, wherein the scrubbing direction is a straight direction 144, which passes above the second bond portion 126, and is perpendicular to a straight line projected on the third surface 113 of the carrier 112. The straight line is defined by the first and second bond portions 121, 126. The second end 125 of the bonding wire 120 is scrubbed in the defined scrubbing direction.

In further embodiments, the scrubbing process of the second end 125 of the bonding wire 120 includes the following steps. A scrubbing direction is defined, wherein the scrubbing direction is a straight direction 146, which passes above the second bond portion 126, and is parallel to the straight line projected on the third surface 113 of the carrier 112 and defined by the first and second bond portions 121, 126. The second end 125 of the bonding wire 120 is scrubbed in the defined scrubbing direction.

Figure 16:
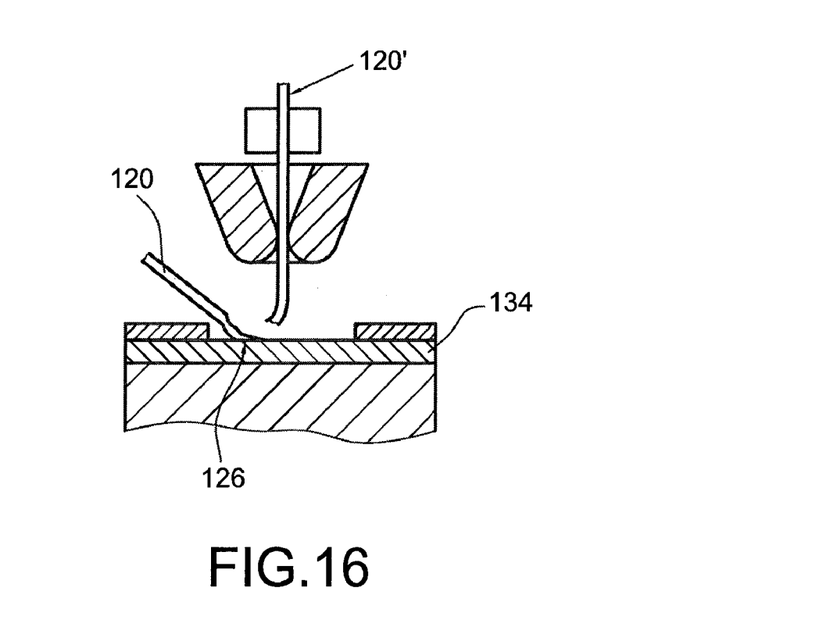
FIG. 16 is a cross-sectional view showing the bonding wire after being separated from the second bond portion in accordance with one or more embodiments.
Figure 17A:
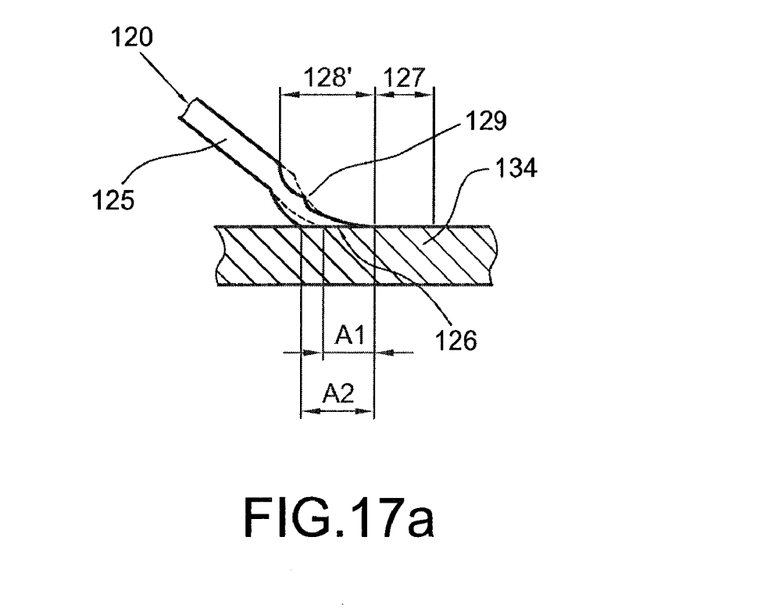
FIGS. 17a and 17b are cross-sectional and perspective views, respectively, showing a new fishtail region formed on the second end of the bonding wire after bonding, scrubbing and separation in accordance with one or more embodiments.
Figure 17B:
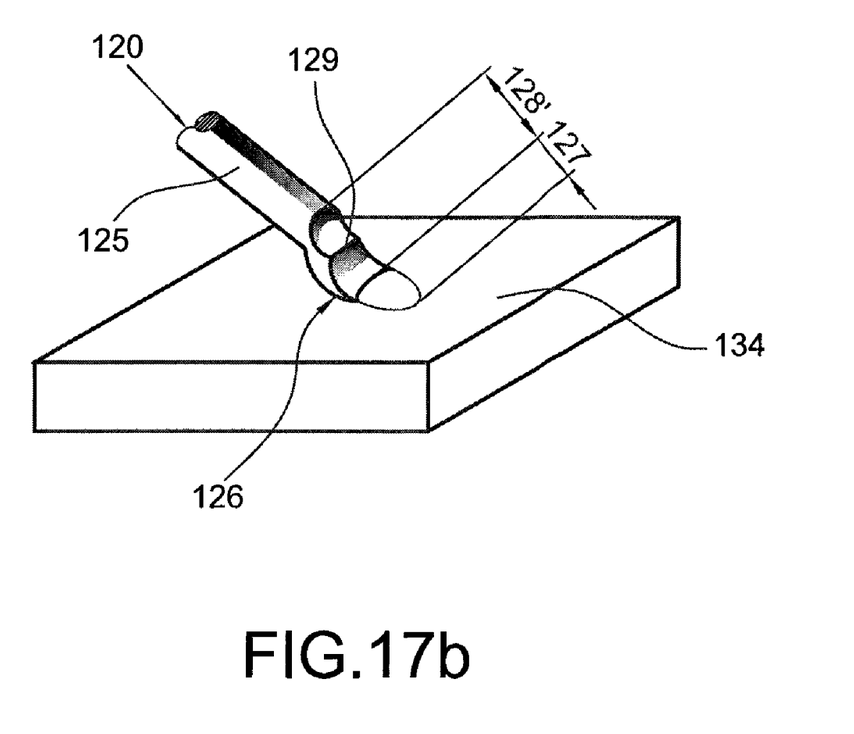

Referring to FIG. 16, the rest 120' of the bonding wire 120 is separated from the separation region 127 of the second bond portion 126 by some movement of the capillary 118 so as to finish the wire bonding structure. Referring to FIGS. 17a and 17b, after the bonding, scrubbing and separating processes of the second end 125 of the bonding wire 120, a new interface surface between the bonding wire 120 and the second pad 134 has a second connecting area A2 (i.e., the connecting area of the second bond portion 126 where scrubbed the second end 125 of the bonding wire 120 contacts the second pad 134), which is larger than the first connecting area A1. This is due to the scrubbing action of the capillary 118 against the bonded second end 125 of the bonding wire 120 that spreads the material (e.g., copper) of the bonded second end 125 onto the second pad 134, thereby increasing an area of the interface surface from the first connecting area A1 to the second connecting area A2. A new fishtail region 128' is also formed on the second end 125 of the bonding wire 120 by the scrubbing action of the capillary 118. The new fishtail region 128' is adjacent to the new interface surface between the bonding wire 120 and the substrate pad 134, i.e., the second bond portion 126 includes the fishtail region 128' and separation region 127. The cross-section of the new fishtail region 128' includes at least one scrubbing protrusion 129 formed by movements of the capillary 118, i.e., the cross-section of the new fishtail region 128' includes more than one curved lines. In the embodiment specifically illustrated in FIGS. 17a-17b, the new fishtail region 128' includes two curves above and below the scrubbing protrusion 129. The lower curve corresponds in shape to a part of the capillary 118 that presses the second end 125 against second pad 134 during the bonding process. The upper curve corresponds in shape to the same or another part of the capillary 118 that scrubs the second end 125 during the scrubbing process. The scrubbing protrusion 129 is integrally formed on the new fishtail region 128', i.e., the scrubbing protrusion 129 is formed by a single bonding process plus a scrubbing process, rather than by multiple bonding processes. The cross-section of the scrubbing protrusion 129 can be of the shape of a hill. In another embodiment, the scrubbing protrusion 129 includes copper and palladium, if the bonding wire 120 is a copper/palladium bonding wire.

According to the disclosed embodiments, the second end of the bonding wire is scrubbed after bonding, and thus the cross-section of the new fishtail region of the second bond portion of the bonding wire includes at least one scrubbing protrusion, and the new interface surface between the bonding wire and the second pad has a larger connecting area A2 than the first connecting area A1 obtained after the bonding process. Thus, the bonding strength between the bonding wire and the second pad can be increased.

Figure 18:
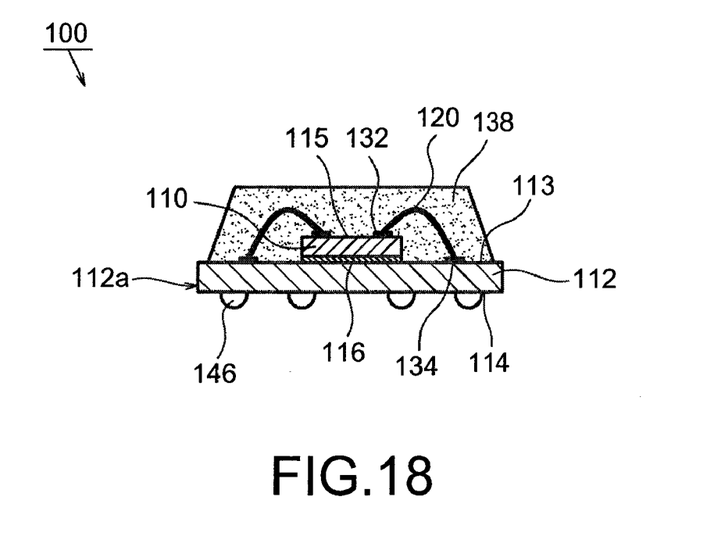
FIG. 18 is a cross-sectional view of the chip and the bonding wire being sealed within and of the carrier being covered by a molding compound in accordance with one or more embodiments.

Referring to FIG. 18, in this particularly illustrated embodiment, the carrier 112 is a substrate 112a. One end of the bonding wire 120 is electrically connected to the first pad 132 of the chip 110, and the other end of the bonding wire 120 is electrically connected to the second pad 134 of the substrate 112a in accordance with one or more embodiments disclosed herein. There can be more than one pair of first and second pads. The first pad 132 of the chip 110 is electrically connected to a circuit (not shown) of the chip 110. The substrate 112a includes external electrical contacts 156 located on the lower surface 114. The substrate 112a further includes a metallic layer (not shown) for covering the second pad 134.

After the bonding, scrubbing and separation processes disclosed herein, the chip 110 and the bonding wire 120 are sealed and the carrier 112 is covered by a molding compound 138, whereby the molding compound 138, the chip 110 and the carrier 112 are formed into a ball grid array (BGA) package 100. In some embodiments, the composition of the molding compound 138 includes chlorine ions and sodium ions, whereby the copper bonding wire 120 is not easily oxidized. Alternatively or additionally, the composition of the molding compound 138 further includes bromine ions. The pH value of the molding compound 138 is between 4 and 7 whereby the copper bonding wire 120 is not easily oxidized.

Figure 19:
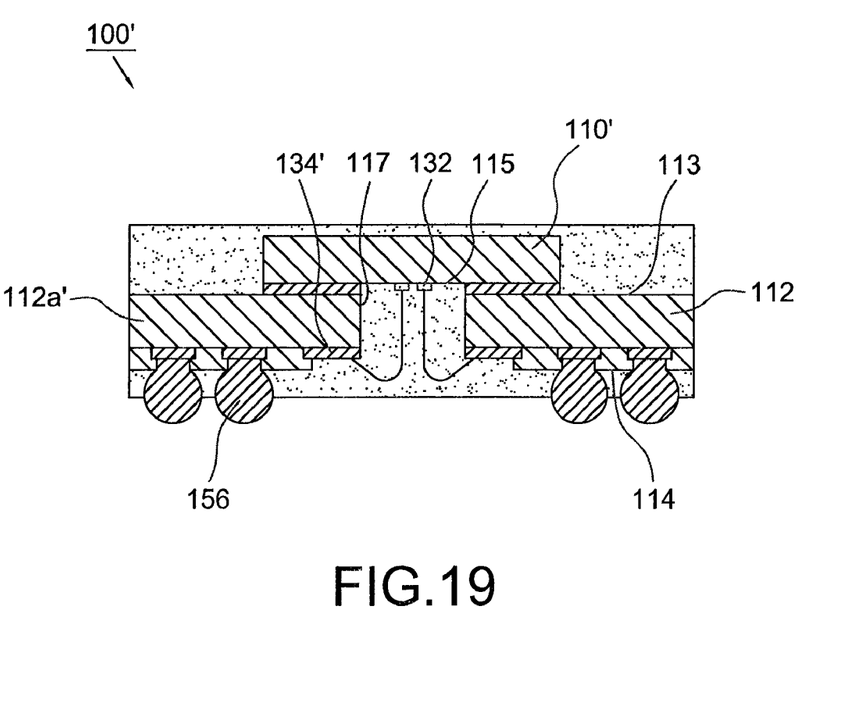
FIG. 19 is a cross-sectional view of a semiconductor package according to further embodiments.

Referring to FIG. 19, in another particularly illustrated embodiment, the disclosed wire bonding structure and method can also be applied to a cavity down type package, e.g., a W type ball grid array (WBGA) package 100'. The semiconductor package 100' is similar to the semiconductor package 100. A noticeable difference between the semiconductor packages 100' and 100 is that the active surface 115 of the chip 110' is disposed on the upper surface 113 of the carrier 112 (e.g., the substrate 112a'). The substrate 112a' includes a through hole 117, which extends from the upper surface 113 to the lower surface 114. The bonding wire 120 passes through the through hole 117, one end of the bonding wire 120 is electrically connected to the first pad 132 of the chip 110', and the other end of the bonding wire 120 is electrically connected to the second pad 134' of the substrate 112a' in accordance with one or more embodiments disclosed herein. There can be more than one pair of first and second pads. The first pad 132 of the chip 110 is electrically connected to a circuit (not shown) of the chip 110. The substrate 112a' includes external electrical contacts 156 located on the lower surface 114.

Figure 20:
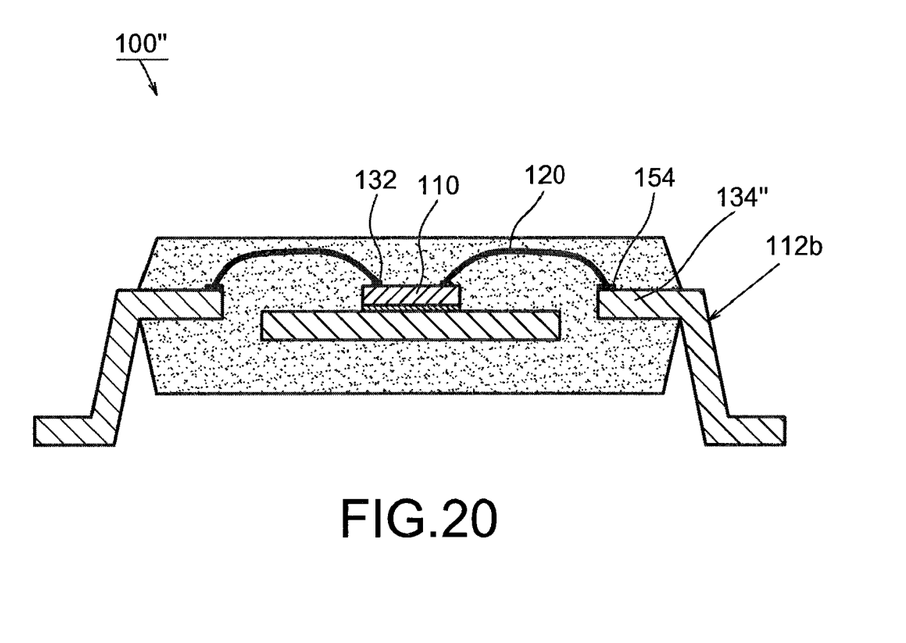
FIG. 20 is a cross-sectional view of a semiconductor package according to yet further embodiments.

Referring to FIG. 20, in a further particularly illustrated embodiment, the disclosed wire bonding structure and method can be applied to a package having leadframe 100". The semiconductor package 100" is similar to the semiconductor package 100. A noticeable difference between the semiconductor packages 100" and 100 is that the carrier 112 is a leadframe 112b. The semiconductor package further includes a pad 134" of a lead and a metallic layer 154, wherein the second pad 134 is replaced with the pad 134" of the lead. The pad 134" of the lead is disposed on the leadframe 112b. The metallic layer 154 covers the pad 134" of the lead. The metallic layer 154 can be one or more of silver (Ag), gold (Au) and palladium (Pd). The pad 134" of the lead is electrically connected to the bonding wire 120 in accordance with one or more embodiments disclosed herein.

Although several embodiments have been disclosed in detail, it is to be understood that many other possible modifications and variations can be made by those skilled in the art without departing from the spirit and scope of the present disclosure.

What is claimed is:

1. A semiconductor package, comprising:
    a chip including a first pad located on an active surface of the chip;
    a carrier including a second pad located on a surface of the carrier, wherein the chip is disposed on the carrier;
    a bonding wire electrically connecting the chip to the carrier and comprising:
        a first bond portion connected to the first pad; and
        a second bond portion connected to the second pad, wherein the second bond portion includes a first concave portion, a second concave portion, and a protrusion between the first concave portion and the second concave portion, wherein the second bond portion includes a lower surface attached to the carrier, and at least a portion of the second concave portion is laterally displaced from the lower surface of the second bond portion; and
    a molding compound encapsulating the chip and the bonding wire.

2. The semiconductor package as claimed in claim 1, wherein:
    the first concave portion extends from the protrusion to the carrier;
    the second concave portion extends from the protrusion to a remaining portion of the bonding wire; and
    the second concave portion is substantially linear in a direction extending along the protrusion.

3. The semiconductor package as claimed in claim 1, wherein:
    the bonding wire comprises a copper core and an anti-oxidative metallic layer covering the copper core;
    the anti-oxidative metallic layer comprises palladium; and
    the protrusion comprises both copper and palladium.

4. The semiconductor package as claimed in claim 1, wherein the protrusion includes a scrubbed surface extending to a junction of the first concave portion and the second concave portion.

5. The semiconductor package as claimed in claim 1, wherein:
    the protrusion is laterally displaced from the lower surface of the second bond portion.

6. The semiconductor package as claimed in claim 1, wherein:
    the protrusion is directly above the lower surface of the second bond portion.

7. The semiconductor package as claimed in claim 1, wherein:
    the first concave portion extends from the protrusion to the carrier;
    the second concave portion extends from the protrusion to a remaining portion of the bonding wire; and
    the second concave portion has a width in the range from 1 µm to 10 µm, the width being along a direction substantially parallel to the carrier and extending lengthwise along the bonding wire.

8. A semiconductor package, comprising:
    a substrate including a pad disposed on the substrate;
    a wire bonded to the pad so as to form a bond portion connected to a remaining portion of the wire, wherein the bond portion includes a peak, a first curved surface extending from the peak to the substrate, and a second curved surface extending from the peak to the remaining portion of the wire, wherein the bond portion includes a lower surface attached to the pad, and at least a portion of the second curved surface is laterally displaced from the lower surface of the bond portion; and
    a package body encapsulating the wire.

9. The semiconductor package of claim 8, wherein:
    the second curved surface is concave in a first direction from the peak to the remaining portion; and
    the second curved surface is substantially linear in a second direction extending along the peak.

10. The semiconductor package of claim 8, wherein:
    the second curved surface is concave in a first direction from the peak to the remaining portion; and
    the second curved surface is concave in a second direction extending along the peak.

11. The semiconductor package of claim 8, wherein:
    at least a portion of the first curved surface is directly above the lower surface of the bond portion.

12. The semiconductor package of claim 8, wherein a majority of the second curved surface is laterally displaced from the lower surface of the bond portion.

13. The semiconductor package of claim 8, wherein substantially all of the second curved surface is laterally displaced from the lower surface of the bond portion.

14. A semiconductor package, comprising:
    a substrate including a pad disposed on the substrate;
    a die disposed on the substrate;
    a wire electrically connecting the die to the substrate, the wire being connected to the pad at a bond portion of the wire, wherein:
        the bond portion includes a lower surface attached to the pad, a protrusion opposite the lower surface, a first indentation above the protrusion, and a second indentation below the protrusion;

at least a portion of the first indentation is laterally displaced from the lower surface of the bond portion; and at least a portion of the second indentation is directly above the lower surface of the bond portion; and a package body encapsulating the die and the wire.

15. The semiconductor package of claim 14, wherein substantially all of the first indentation is laterally displaced from the lower surface of the bond portion.

16. The semiconductor package of claim 14, wherein substantially all of the second indentation is directly above the lower surface of the bond portion.

17. The semiconductor package of claim 14, wherein the protrusion is laterally displaced from the lower surface of the bond portion.

18. The semiconductor package of claim 14, wherein the protrusion is directly above the lower surface of the bond portion.

19. The semiconductor package of claim 14, wherein the first indentation has a width in the range from 1 µm to 10 µm, the width being along a direction substantially parallel to the substrate and extending lengthwise along the wire.

20. The semiconductor package of claim 14, wherein:

the first indentation has a first width, the first width being along a direction substantially parallel to the substrate and extending lengthwise along the wire; and the second indentation has a second width greater than the first width, the second width being along the direction parallel to the substrate and extending lengthwise along the wire.

* * * * *